United States Patent [19]

Takeuchi et al.

[11] Patent Number: 5,231,467
[45] Date of Patent: Jul. 27, 1993

[54] REFLECTIVE ALIGNMENT POSITION SIGNAL PRODUCING APPARATUS

[75] Inventors: Hiroyuki Takeuchi, Kawasaki; Masaki Yamamoto, Tokyo; Takeo Sato, Kawasaki; Yoshiyuki Sugiyama, Ayase; Shinichiro Aoki, Kawasaki, all of Japan

[73] Assignee: Matsushita Electric Industrial Co., Ltd., Osaka, Japan

[21] Appl. No.: 762,111

[22] Filed: Sep. 19, 1991

[30] Foreign Application Priority Data

Sep. 20, 1990 [JP] Japan .................. 2-252405

[51] Int. Cl.$^5$ .................................. G01B 9/02
[52] U.S. Cl. .......................... 356/356; 356/363; 356/401
[58] Field of Search ............ 356/401, 400, 349, 356, 356/363

[56] References Cited

U.S. PATENT DOCUMENTS

| 4,492,459 | 1/1985 | Omata . |
| 4,795,244 | 1/1989 | Uehara et al. ............. 356/401 |
| 4,798,962 | 1/1989 | Matsumoto et al. ........ 356/401 |
| 4,880,310 | 11/1989 | Nishi .......................... 356/401 |
| 4,900,939 | 2/1990 | Aoyama ...................... 356/401 |
| 5,070,250 | 12/1991 | Komatsu et al. ............ 356/401 |

FOREIGN PATENT DOCUMENTS

| 0309281 | 3/1989 | European Pat. Off. . |
| 62-293718 | 12/1987 | Japan . |
| 63-14430 | 1/1988 | Japan . |
| 63-78004 | 4/1988 | Japan . |

OTHER PUBLICATIONS

"Phase Grantings as Waferstepper Alignment Marks for all Process Layers" by S. Wittekoek et al.; SPIE vol. 538 Optical Microlighography IV (1985); pp. 24–31.

"Correction of Chromatic Averration of Projection Moire Type Alignment" by T. Nomura et al.; Precision Technology Society Symposium; 1989 Autumn Version.

Primary Examiner—Samuel A. Turner
Attorney, Agent, or Firm—Lowe, Price, LeBlanc & Becker

[57] ABSTRACT

A position signal producing apparatus, for an apparatus for project-printing a pattern on a reticle onto a wafer through a project lens system with exposure light, for producing a position signal indicative of the position of the wafer is disclosed, wherein two different frequency components of alignment light whose frequencies are different from that of the exposure light are interfered with each other at a position alignment blank to form interference fringes having a given pitch. The interference fringes are projected onto a diffraction grating through an achromatizing optical system and the project lens system. Diffracted light returning from the diffraction grating is received by a photodetector which provides a light beat signal. A position deviation signal obtained by phase comparison of the light beat signal provides position alignment by controlling relative positions between the position alignment blank and the diffraction grating. Two light beams of the two different frequency components split by a polarized beam splitter are equalized in image converting condition, or image aspect, by a mirror, so that an accurate mixing of the two frequency components of light beams is performed at the position alignment blank.

8 Claims, 6 Drawing Sheets

REFLECTIVE ALIGNMENT POSITION SIGNAL PRODUCING APPARATUS

BACKGROUND OF THE INVENTION

1. Field of the Invention

This invention relates to a position signal producing apparatus, for use with an exposure apparatus, for producing a position signal indicative of position along an axis of a wafer on which an image of a reticle is to be projected.

2. Description of the Prior Art

Recently, in semiconductor manufacturing apparatus, a demand for high density arrangement of elements has been increasingly developed, so that thickness of circuit patterns of each element are reaching to a value lower than 0.5 μm. In exposing processes of such fine circuit patterns, it is extremely important to consist one pattern position with another pattern at every exposing process to carry out many times of overwrite exposure which is necessary for producing semiconductor products. Such processing requires positioning accuracy of less than 0.1 μm.

A position signal producing apparatus of a prior art is disclosed in Japanese Patent Laid-open Publication No. 63-78004. Hereinbelow will be described the above-mentioned prior art position signal producing apparatus with reference to FIG. 13.

FIG. 13 diagrammatically shows the arrangement of a prior art exposure apparatus in which the position signal producing apparatus is incorporated. In FIG. 13, alignment light emitted from a laser light source 101, which is coherent and includes two frequency components, is split into two light beams by a half mirror 102 and is diffracted by a first pair of diffraction gratings 104a and 104b formed on a reticle 103, respectively. Each diffracted light is projected onto a second pair of diffraction gratings 110a and 110b provided on a wafer 109 through a first lens system 105a and 105b, a spatial filter 106a and 106b, a second lens system 107a and 107b, and a project lens system 108. The diffracted light 111a and 111b is introduced into photodetectors 112a and 112b in the opposite direction through the project lens system 108 and the second lens systems 107a and 107b. When two beams are projected onto the second diffraction gratings 110a and 110b on the wafer 109 with suitable directions, respectively, each diffraction light is diffracted in such a direction that diffracted light overlaps each other and interfere with each other. Light intensities of a pair of interfered diffracted light are detected by the photodetectors 112a and 112b. The detected results are compared by a comparator 113. In accordance with the detected results, a control system 114 drives the wafer 109, so that the difference of the above-mentioned diffracted light intensity equals zero. Thus, position alignment between the reticle 103 and the wafer 109 is performed.

On the other hand, the pattern of the reticle 103 is illuminated by a projecting light source 115 and an illumination optical system 116. The project image is focused onto the wafer 109 through the project lens system 108.

However, the above-mentioned prior art arrangement is effective only when the wavelength of exposure light emitted from the projecting light source 115 and the wavelength of alignment light emitted from the laser light source 101 are substantially equal to each other and the project lens system 108 displays good focusing characteristic to both light. It is very difficult to build up an achromatic project lens system where ultraviolet light is used for the exposure light, on the other hand visible light is used for the alignment light. This is because kinds of glass materials for making up a dioptric system are limited at wavelength of ultraviolet light. For example, ultraviolet light is generated by a KrF excimer laser.

In other words, the project lens system 108 is so designed as to sufficiently achromatize at exposure wavelength and thus, shows large chromatic aberration for other wavelength light. Therefore, it is desired that wavelength of the alignment light is sufficiently close to that of the exposure light. However, from a point of view of producing semiconductor products, it is desired that the wavelength of the alignment light is sufficiently separated from that of the exposure light. This is because a high sensitive resist such as a chemically sensitized resist may be exposed by and respond to the alignment light with a high sensitivity. Further, a multilayer resist used for compensation of limit of focusing characteristic of the project lens system 108, or a resist layer containing die for preventing multireflection may absorb the alignment light whose wavelength is close to that of the exposure light. In other words, the wavelength of the alignment light should be sufficiently separated from that of the exposure light from the reasons involved in the semiconductor manufacturing process. Therefore, in the above-mentioned prior art arrangement, there is a problem that position alignment between the reticle and the wafer with high accuracy is difficult to perform.

SUMMARY OF THE INVENTION

With the foregoing drawbacks of the prior art in view, it is an object of the present invention to provide a position signal producing apparatus which provides a highly accurate through the lens (TTL) alignment system including a project lens system having a diffraction grating, and is capable of performing a position alignment between first and second object with high accuracy even when alignment light whose wavelength is different from that of exposure light is used.

According to the invention, there is provided a position signal producing apparatus, for use with an exposure apparatus for project-printing a pattern on a reticle onto an wafer through a project lens system with exposure light, for producing a position signal indicative of position of the wafer along an axis, the apparatus comprises: (a) a light source for emitting coherent light whose frequency is different from that of the exposure light; (b) splitting means for splitting the coherent light into first and second light beams; (c) first reflecting means for reflecting the first light beam toward a given place of the reticle, the given place being on an annular region within a circle defined by field angle of the project lens system on the reticle; (d) second reflecting means for reflecting the second light beam toward the given place to produce first interference fringes together with the first light beam; (e) means for equalizing an image converting condition of the first light beam with an image converting condition of the second light beam as being erect images or inverted images before the first and second light beams are projected on the give place of the reticle, the first reflecting means, the second reflecting means and the equalizing means being arranged to make stripes of the interference fringes perpendicular to the axis; (f) achromatizing means provided between the reticle and the project lens system for receiving the first interference fringes generated by the reticle and for achromatizing the project lens system at wavelengths of the coherent light, so as to image second interference fringes on the wafer in correspondence with the first interference fringes with chromatic aberration removed, the second interference fringes having a pitch of n1; (g) a diffraction grating formed on the wafer where the second interference fringes are to be imaged by the project lens system through the achromatizing means, the diffraction grating producing diffracted light with the second interference fringes so that interfered light having an beat frequency is generated, a pitch of the diffraction grating being n2, strips of the diffraction grating being arranged perpendicular to the axis, the pitches n1 and n2 being selected such that they make a ratio of an integer; and (h) photodetection means responsive to the interfered light from the diffraction grating received through the project lens system, the achromatizing means, and the reticle for producing the position signal in accordance with a periodical change of intensity of the interfered light.

With the equalizing means thus provided, the first and second light beams have an identical image aspect or orientation which insures accurate superposition or mixing of the light beams, leading to a considerable improvement in the position alignment accuracy.

The equalizing means comprises a mirror disposed between the splitting means and the given place of the reticle for reflecting one of the first and second light beams. The splitting means comprises a polarized beam splitter which transmits one of the first and second light beams and reflects the other of the first and second light beams. The equalizing means comprising a mirror is disposed between the polarized beam splitter and one of the first and second reflecting means for reflecting the one light beam.

Priferably, the first light beam has a first optical path extending between the splitting means and the given place, while the second light beam has a second optical path extending between the splitting means and the given plate, the first and second optical paths having a same length. The splitting means, the first and second reflecting means and the equalizing means are integrally constructed as a single unit.

The position signal producing apparatus may further comprises: a second diffraction grating provided on the reticle and adjacent to the given plate for producing a second position light signal by interference of the second diffraction grating with the interference fringes formed on the reticle and for reflecting the interference fringes by diffraction, stripes of the second diffraction grating being arranged perpendicular to the axis; second phtodetection means responsive to the second light signal for producing a second position signal from the second diffraction grating; and a phase difference detector responsive to the position signal and the second position signal for producing a position control signal.

The above and other objects, features and advantages of the present invention will become more apparent from the following description when making reference to the detailed description and the accompanying sheets of drawings in which preferred structural embodiments incorporating the principles of the present invention are shown by way of illustrative examples.

DETAILED DESCRIPTION OF THE PREFERRED EMBODIMENTS

Figure 1:
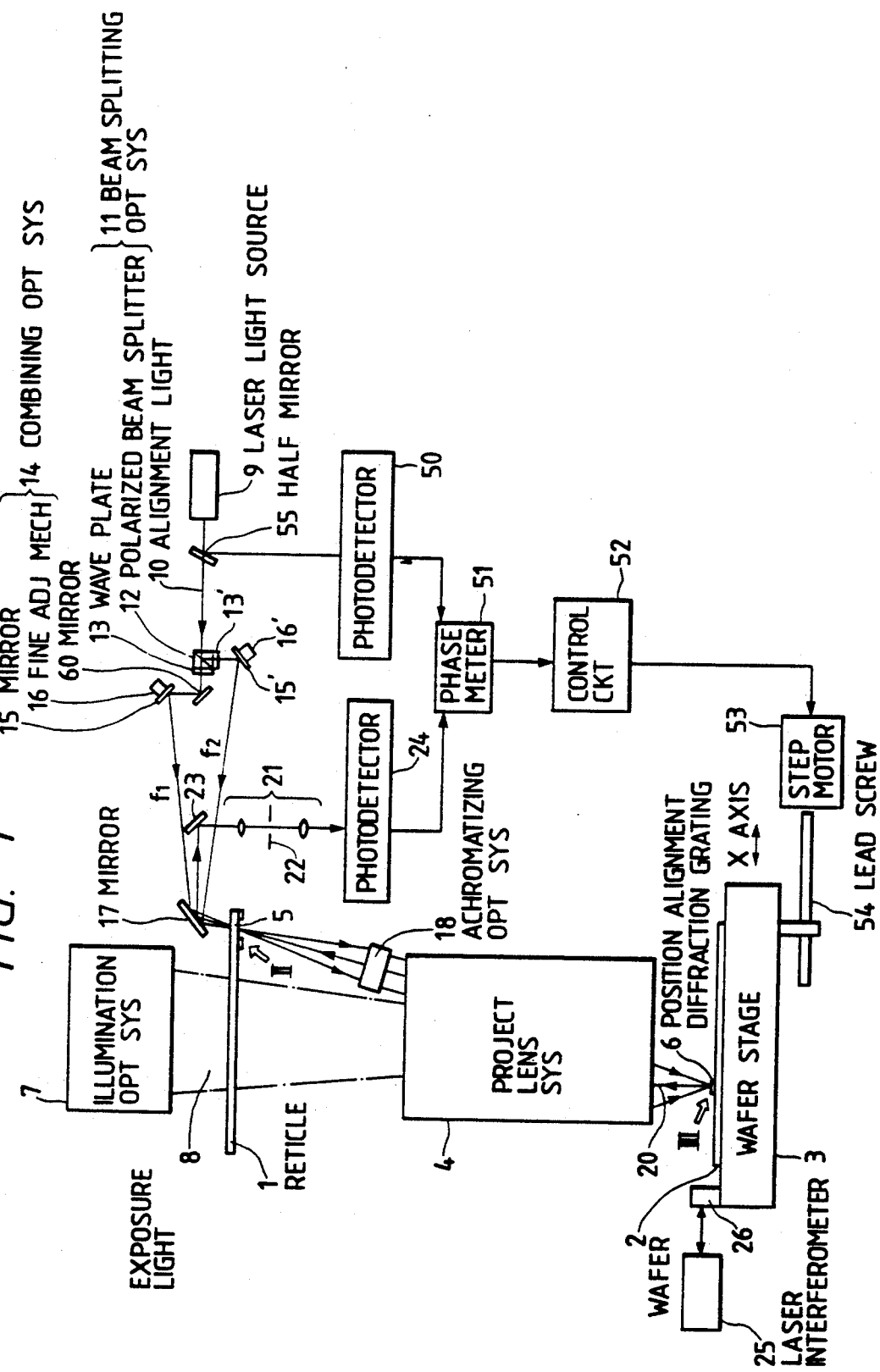
FIG. 1 is a diagrammatical view showing the general construction of a position signal producing apparatus according to a first embodiment of this invention.

Referring now to the drawings, wherein like reference characters designate like or corresponding parts throughout the several views, there is shown in FIG. 1 the general construction of a position signal producing apparatus according to a first embodiment of the invention. In this embodiment, only position alignment in X axis out of X, Y, and $\theta$ axes is described. However, position alignment of other axes can be carried out in the same manner.

In FIG. 1, a reticle 1 as a first object is illuminated by an illumination optical system 7 for projecting a circuit pattern onto a wafer 2 by a project lens system 4. The wafer 2 as a second object is moved by a wafer stage 3 along the X axis. The reticle 1 is arranged on an objective plane of the project lens system 4, while the wafer 2 is arranged on an imaging plane of the project lens system 4. A position alignment mark (hereinafter referred to as "position alignment blank") 5 is provided at a peripheral portion of a field angle of the project lens system 4 on the reticle 1. Another position alignment mark (hereinafter referred to as "position alignment diffraction grating") 6 is provided at a portion corresponding in position to the position alignment blank 5, on the wafer 2 with respect to the project lens system 4. The illumination optical system 7 comprises a KrF excimer laser for emitting ultraviolet light. Numeral 8 is exposure light transmitted through the illumination optical system 7. A light source 9 emits coherent alignment light 10 including two different frequency components f1 and f2, each component being polarized orthogonally with each other. The light source 9 comprises a Zeeman laser. described later.

The alignment light 10 emitted by the laser light source 9 enters a beam splitting optical system 11. The beam splitting optical system 11 comprises a polarizing beam splitter 12 for splitting the alignment light 10 emitted from the laser light source 9, wave plates 13 and 13′ for respectively circularly polarizing frequency components f1 and f2 split by the polarizing beam splitter 12, and a mirror 60 for perpendicularly reflecting part of the alignment light 10 transmitted though the polarizing beam splitter 12 and the wave plate 13. The wave plates 13 and 13′ can be provided between the reticle 1 and the wafer 2.

The alignment light 10 passed the beam splitting optical system 11 enters a combining optical system 14 for combining frequency components f1 with f2 to produce interference fringes 19 on the position alignment blank 5. The combining optical system 14 comprises mirrors 15 and 15′ for reflecting the frequency components f1 and f2 split by the beam splitting optical system 11, and fine adjustment mechanisms 16 and 16′ provided to the respective mirrors 15 and 15′ for adjusting an angle of the corresponding mirror 15 and 15′. The frequency components f1 and f2 of the alignment light 10 reflected at the mirrors 15 and 15′, respectively, are subsequently reflected by a mirror 17 toward the position alignment blank 5 of the reticle 1, with frequency components f1 and f2 interfered with each other.

A compensating optical system comprised of an achromatizing optical system 18 is provided between the position alignment blank 5 and the project lens system 4 for achromatizing the project lens system 4 to reproduce progressive type interference fringes 19 (see FIG. 2) on the position alignment diffraction grating 6 as interference fringes 30. The interference fringes 30 formed on or above the position alignment diffraction grating 6 are diffracted by the position alignment diffraction grating 6. Numeral 20 is diffracted light diffracted by the position alignment diffraction grating 6 and advances perpendicularly to the wafer 2. Numeral 21 is a spatial filtering optical system comprising a spatial filter 22 for transmitting only a middle portion of the light beam reflected by the mirrors 17 and 23, coming from the position alignment grating 6 through the project lens system 4, achromatizing optical system 18, and reticle 1. Numeral 24 is a photodetector into which the diffracted light 20 transmitted through the spatial filtering optical system 21 is introduced. Numeral 25 is a laser interferometer for measuring the position of the wafer 2, and numeral 26 is an L shape mirror mounted on the wafer stage 3.

The position signal producing apparatus of the foregoing construction will be described below in greater detail in conjunction with the operation thereof.

Figure 5:
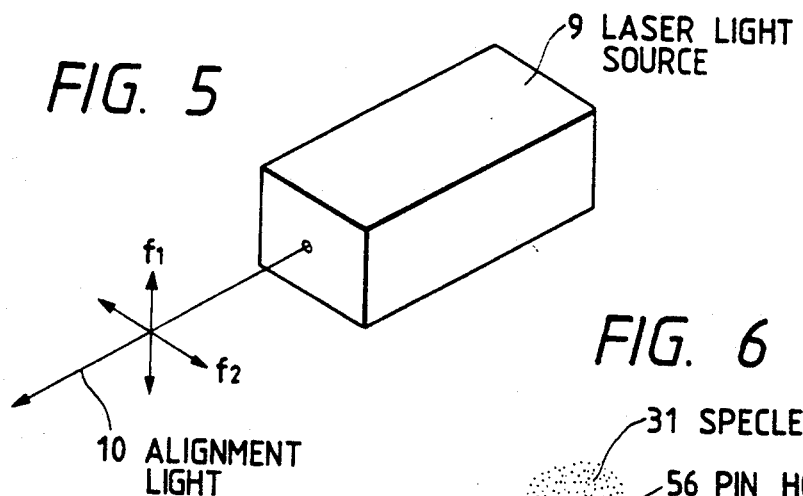
FIG. 5 is a perspective view of a laser light source of the apparatus.

The laser light source 9 shown in FIG. 1 for position alignment is an optical unit which is constructed to emit the coherent alignment light 10 including components of frequencies f1 and f2, each component being polarized orthogonally with each other, as shown in FIG. 5. In this embodiment, a Zeeman laser is used which produces two frequency components, each component orthogonally polarized by application of a magnetic field to the laser tube. As an alternative, a light modulator using a unidirectionally propagating ultrasonic wave may be used for such an optical unit. There is also an optical unit for generating two frequency components by Doppler shifting the frequency of the laser light with a rotating diffraction grating. Generally, the frequency difference between two frequencies f1 and f2 is from tens kHz to tens MHz.

The alignment, light 10 emitted form the laser light source 9 is split into frequency components f1 and f2 by the polarizing beam splitter 12 in the beam splitting optical system 11 and then the frequency component f1 of linearly polarized light is circularly-polarized by the wave plate 13. Likewise, the frequency component f2 of linearly polarized light is circularly-polarized by the wave plate 13′. For the beam splitting optical system 11, a Wollaston prism utilizing double refraction can be used other than the polarizing beam splitter 12 utilizing dielectric multilayer. The frequency components f1 and f2 are circularly-polarized because the linearly polarized light is subjected to intensity change by multi-reflection, so that there is little noise margin of alignment signal intensity if linearly polarized light would be used for aligning of the wafer 2.

The frequency component f1 (i.e., a first beam) of the alignment light 10 which is transmitted through the polarized beam splitter 12 is reflected by a mirror 60 in a perpendicular direction toward the mirror 15 of the combining optical system 14. On the other hand, the frequency component f2 (i.e., a second beam) of the alignment light 10 which is reflected by the polarized beam splitter 12 projects directly on the mirror 15′ of the combining optical system 14. With the mirror 60 thus provided, an image converting condition of the first beam and an image converting condition of the second beam match with each other as being erect images. The mirror 60 may be disposed between the mirror 15′ and the mirror 17 in which instance the first and second beams have an identical image aspect (image converting condition) comprising inverted images. With this matching of the image converting condition, images formed by the first and second beams projected on the reticle 1 can be accurately superposed with each other without involving an geometric error relative to the images of the first and second beams before they are split from the alignment light 10 by the polarized beam splitter 12. As a result, the accuracy of a light signal produced is high.

Figure 2:
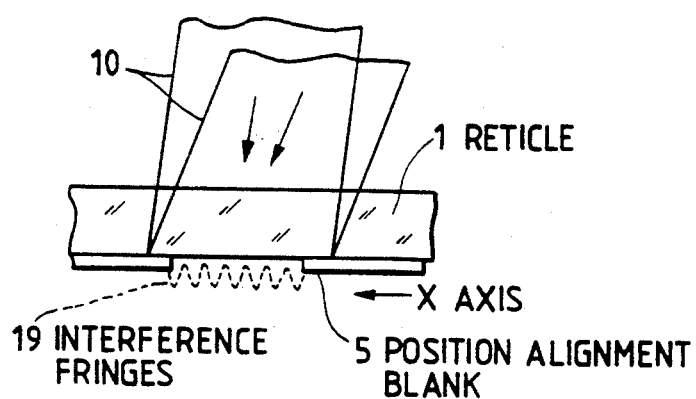
FIG. 2 is an enlarged view of a portion indicated by the arrow II in FIG. 1.

The alignment light 10 with f1 and f2 components of an identical image aspect is reflected by the mirrors 15 and 15′ of the combining optical system 14 and is projected onto the position alignment blank 5 on the reticle 1 with these components interfered by the mirror 17. The mirrors 15 and 15′ in the combining optical system 14 can be replaced with a prism, etc., utilizing total reflection. The frequency components f1 and f2 of the alignment light 10 are mixed with each other on the position alignment blank 5 and interfered with each other to produce interference fringes 19 (FIG. 2). Pitch of the interference fringes 19 is adjusted to about 8 $\mu$m by adjusting the reflection angle of the mirrors 15 and 15′ with the fine adjustment mechanisms 16 and 16′. This pitch of the interference fringes 19 can be adjusted within several percent for the reasons described later.

Since the number of reflection of the frequency component f1 is the same as that of the frequency component f2, these frequency components f1 and f2 projected onto the position alignment blank 5 are mixed with each other in the same manner as done with the frequency components f1 and f2 before the splitting by the polarized beam splitter 12. With this matching of the number of reflection of both frequency components f1 and f2, the position alignment accuracy is improved. By equaling the first and second frequency components f1 and f2 for the length of an optical path between the polarized beam splitter 12 and the position alignment blank 5, it is possible to reproduce a light wave surface at a point of the polarized beam splitter 12 where incident light is split into two beams of frequency components f1 and f2. The alignment light 10 has an increased degree of spatial coherency which improves the position alignment accuracy.

The beam splitting optical system 11 and the combining optical system 14 are integrally constructed as a single optical unit, so that an angle of projection of each beams projected from such a single optical unit is always constant even when a common plane of both beams is displaced. The single optical unit can be adjusted accurately with utmost ease. The accuracy of the optical unit can be maintained for a long service time without deterioration.

The frequency components f1 and f2 of the alignment light 10 interfere with each other and, due to the difference in frequency of two components f1 and f2, a wave pattern of the interference fringes 19 progresses along X axis at a beat frequency of f1 and f2, as shown in FIG. 2, though a spot of the interference fringes 19 does not move. This interference fringes 19 of progressing waves is referred to as progressive type interference fringes 19. Strips of the interference fringes are arranged perpendicular to X axis by arranging the polarizing beam splitting optical system in a plane including X axis. Strips of the position alignment diffraction grating are also arranged perpendicular to X axis.

Figure 4:
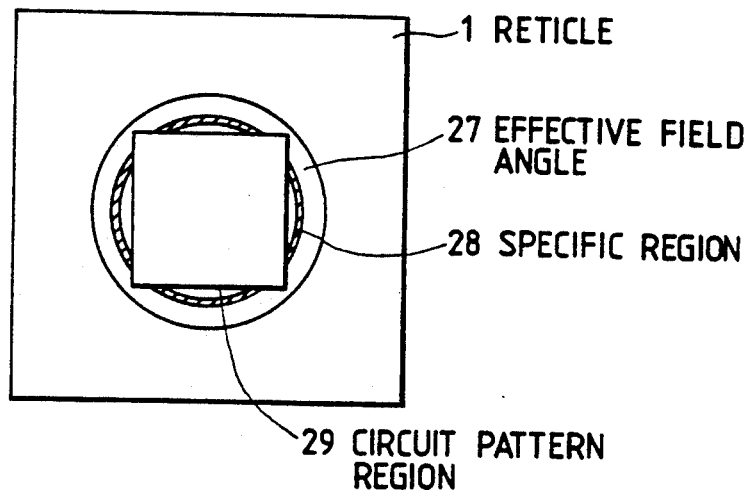
FIG. 4 is a plan view of a reticle showing a specified region in the effective field angle of a project lens whose chromatic aberration is to be compensated.

The exposure light 8 emitted from a KrF excimer laser is projected onto the reticle 1 through the illumination optical system 7. The image of a circuit pattern on the reticle 1 is projected onto the wafer 2 by the project lens system 4. As mentioned above, the project lens system 4 is designed to match the wavelength of the exposure light 8. Thus, it is impossible to focus the progressive type interference fringes 19 by only the project lens system 4 due to large chromatic aberration. However, it is possible to sufficiently achromatize the project lens system 4 with respect to only a specific region where the progressive type interference fringes 19 is formed on the reticle 1, other than the circuit pattern is formed. Then, the achromatizing optical system 18 achromatizes the project lens system 4 with respect to only the specific region 28 (the same solid torus in FIG. 4) in the effective field angle 27 of the project lens system 4. Thus, the progressive type interference fringes 19 generated within the specific region 28 on the reticle 1 from the components f1 and f2 of the alignment light 10 emitted from the laser light source 9 is accurately focused on the wafer 2. In FIG. 4, numeral 29 shows a circuit pattern region.

The above-mentioned achromatizing optical system 18 will be described in greater detail. There are two functions of the achromatizing optical system 18 as follows:

(1) Achromatizing the project lens system 4 due to difference in wavelength between the exposure light and the position alignment light.

A synthetic quartz used for the project lens system 4 which is suitable for the ultraviolet exposure light 8 ($\lambda = 248.5$ nm) generated by the KrF excimer laser has different refractive indexes between ultraviolet and visible light, such as the alignment light 10. Thus, chromatic aberration of the project lens system 4 so designed as to match the excimer laser light is extremely large at the wavelength of the alignment light 10, so that it is very difficult to design the achromatizing optical system 18 with achromatizing over full field angle of the project lens system 4. Then, achromatizing for a specified region 28 where the position alignment blank 5 exists within the field angle of the project lens system 4, other than the circuit pattern region makes it easy to design the achromatizing optical system 18. As described above, it is possible to project the progressive type interference fringes 19 generated at wavelengths of the alignment light 10 onto the wafer though a combination of the achromatizing optical system and the project lens system with sufficiently small aberration and sufficient MTF.

(2) Compensating projection magnification of the alignment light 10 between the reticle 1 and the wafer 2.

Figure 3:
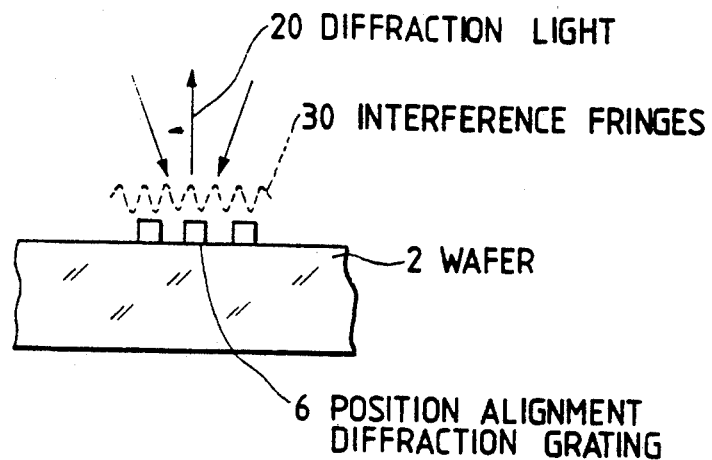
FIG. 3 is an enlarged view of a portion indicated by the arrow III in FIG. 1.

The project lens system 4 has a focal length at a wavelength of the alignment light 10 longer than that at the exposure light because the alignment light 10 is longer in wavelength than the exposure light. For example, the focal length of the project lens system 4 at He—Ne laser light is tens times that of the exposure light, and thus, the magnification of the former is tens times that of the latter. Further, those image formation positions differ from each other. There are many difficulties in designing of the achromatizing optical system 18 to equalize the projection magnification for the alignment light 10 to that for the exposure light 8 under this relationship. Thus, it is desired that the projection magnification for the alignment light 10 is made around one if the projection magnification at the wavelength of the exposure light is 1/5. On the other hand, it is difficult in manufacturing and assembling of lenses to make the total magnification for the achromatizing optical system 18 and the project lens system "1.0" accurately with chromatic aberration perfectly compensated. Thus, another compensation mechanism for compensating the error of total magnification is required. This compensation mechanism is the fine adjustment mechanism 16 and 16' in the combining optical system 14. When the total magnification is 1.01, the fine adjustment mechanisms 16 and 16' are so adjusted that the pitch of the progressive type interference fringes becomes 0.99 times unadjusted pitch, so that the pitch of the progressive type interference fringes 30 projected on the wafer 2 (see FIG. 3) can be adjusted to 1.0 accurately.

The progressive type interference fringes 19 formed on the reticle 1 is projected through the achromatizing optical systems 18 and the project lens system 4 onto the wafer 2 to form another progressive type interference fringes 30 on or above the position alignment diffraction grating 6 again. Position of the wafer 2 is roughly adjusted previously. The diffraction grating 30 formed on or above the position alignment diffraction grating 6 is diffracted. First order diffraction light advances perpendicularly from the wafer 2 as a diffraction light 20. The pitch of the progressive type interference fringes 30 is adjusted to be equal to that of the position alignment diffraction grating 6 on the wafer 2 previously with respect to zero-order diffraction light by adjusting the combining optical system 14. Thus, the intensity of the diffracted light 20 developed by the progressive type interference fringes 30 and the position alignment diffraction grating 6 changes with a beat frequency, namely, a frequency difference between f1 and f2. When the pattern of the progressive type interference fringes 30 overlaps the position alignment diffraction grating 6 with 0° phase difference, the intensity of the diffraction light 20 reaches a maximum. When the progressive type interference fringes 30 overlap the position alignment diffraction grating 6 with 180° phase difference in period of interference fringes 30, the intensity of the diffraction light 20 reaches a minimum. Therefore, the intensity change of the diffracted light 20 includes position difference information of the position alignment diffraction grating 6 in the phase of alternative component. Therefore, there is provided accurate position deviation of the wafer 2 from a phase meter 51 to which an intensity signal of the diffracted light 20 detected by the photodetector 24 as a position signal is applied.

Figure 6:
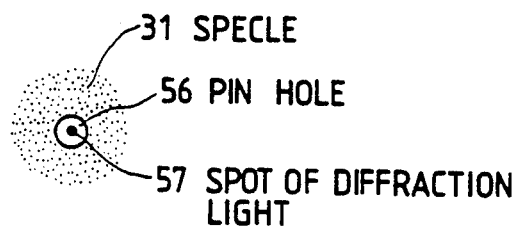
FIG. 6 is a plan view illustrating the operation of a spatial filter in an spatial filtering optical system of the apparatus.

Operation of the spatial filtering optical system 21 is described. For instance, if a surface of the wafer 2 is rough due to aluminum patterns, the diffraction light 20 also includes speckles generated by the aluminum patterns on Fourier plane of the spatial filtering optical system 21, as shown in FIG. 6. In FIG. 6, a speckle pattern 31 can be removed by using a spatial filter 22 which transfers only its center portion around its optical axis on Fourier plane.

An output signal of the photodetector 24 which includes the position information of the wafer 2 in its phase is applied to the phase meter 51 whose other input is supplied with an output of a photodetector 50. The photodetector 50 receives frequency components f1 and f2 from the laser light source 9 through a half mirror 55 as a reference. The phase meter 51 detects phase relationship between the output signal of the photodetector 24 and the output of the photodetector 50. An output of the phase meter 51 with position information is applied to a control circuit 52 for controlling a step motor 53. The step motor 53 drives the wafer stage 3 through a lead screw 54.

In this embodiment, accuracy in mounting positional relation between the achromatizing optical system 18 and the project lens system 4 is very important. If the achromatizing optical system 18 is displaced due to some reasons, the conjugate relation between the position alignment mark (position alignment blank) 6 on the reticle 1 and the position alignment mark (position alignment diffraction grating) 6 on the wafer 2 is not realized. Therefore, the achromatizing optical system 18 should be mounted firmly with respect to the project lens system 4 with stability for a long time interval. Thus, a devising is effective such as the achromatizing optical system 18 manufactured in one piece structure together with the project lens system 4.

Figure 7A:
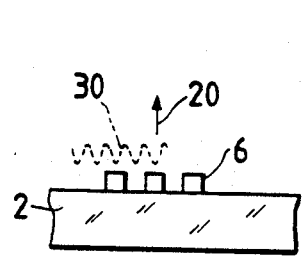
FIGS. 7A through 7C are views illustrative of the operation of the apparatus.
Figure 7B:
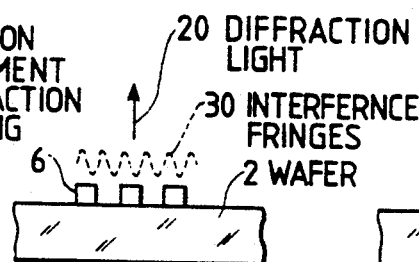
Figure 7C:
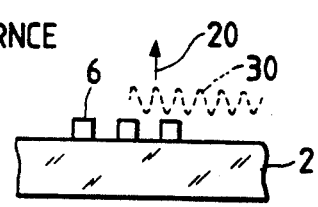
Figure 8:
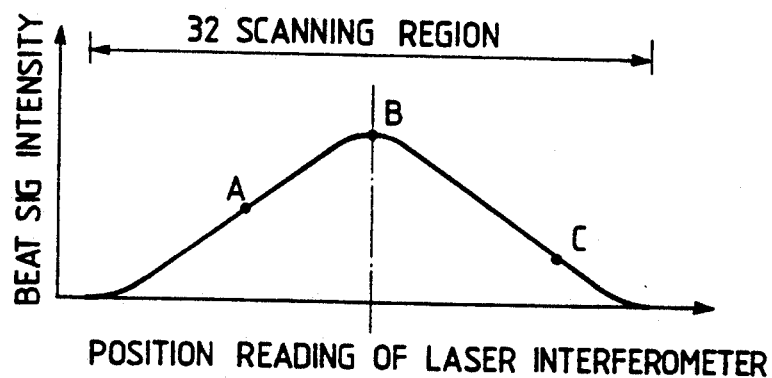
FIG. 8 is a graph showing changes of the degree of overlapping of a interference fringes on a wafer with a position alignment diffraction grating.

In the above-mentioned position deviation detection has a detection range which is half of the pitch of the position alignment diffraction grating 6 on the wafer 2, due to the periodicity of the position alignment mark used. On the other hand, it is possible to obtain a substantially unlimited detection range by using a projection image of the position alignment blank 5 on the reticle 1 with the intensity of beat signal. This will be described with reference to FIGS. 1 and 7A through 7C. The wafer 2 mounted on the wafer stage 3 is scanned at a constant speed. The wafer stage 3 scans a scan region 32 (FIG. 8) expected to include a position where the position deviation amount is zero. As shown in FIGS. 7A-7C, the degree of overlapping of the progressive type interference fringes 30 with the position alignment diffraction grating 6 changes with the position of the wafer 2. In FIG. 7A, the number of bars of diffraction fringes 30 overlapping the position alignment diffraction grating 6 is about three. Thus, the amplitude of the output signal of the photodetector 24 is low. In FIG. 7B, the number of bars of diffraction fringes 30 overlapping the position alignment diffraction grating 6 is five or six. Thus, the amplitude of the output of signal of the photodetector 24 is high. In FIG. 7C, the number of bars of diffraction fringes 30 overlapping the position alignment diffraction grating 6 is about two. Thus, the amplitude of the output signal of the photodetector 24 is also low. This change is shown in FIG. 8 where the amplitudes shown in FIGS. 7A-7C are shown by corresponding points A, B and C in FIG. 8. generally, a pattern like a triangle as shown in FIG. 8 is obtained as follows:

The position obtained by coordinate of the laser interferometer 25 during scanning of the wafer stage 3 is taken as the axis of abscissa, and the amplitude of the beat signal is taken as the axis of ordinate. The position of the wafer 2 when position deviation is zero can be obtained by calculating the center position of the triangle shape pattern. This detection accuracy is not sufficient compared with the final position alignment between the reticle 1 and the wafer 2. However, there is provided a sufficient accuracy by combination of coarse alignment done by detecting a maximum amplitude position which provides an extremely wide detection range with the above-mentioned position deviation detection by phase detection.

In the first embodiment described above, the position deviation detection of the wafer 2 is obtained by providing the progressive type interference fringes 19 on the reticle 1 once and then projecting the progressive type interference fringes 19 onto the wafer 2. In a third embodiment, position alignment is made for not only the wafer 2 but also the reticle 1 at the same time.

Figure 9:
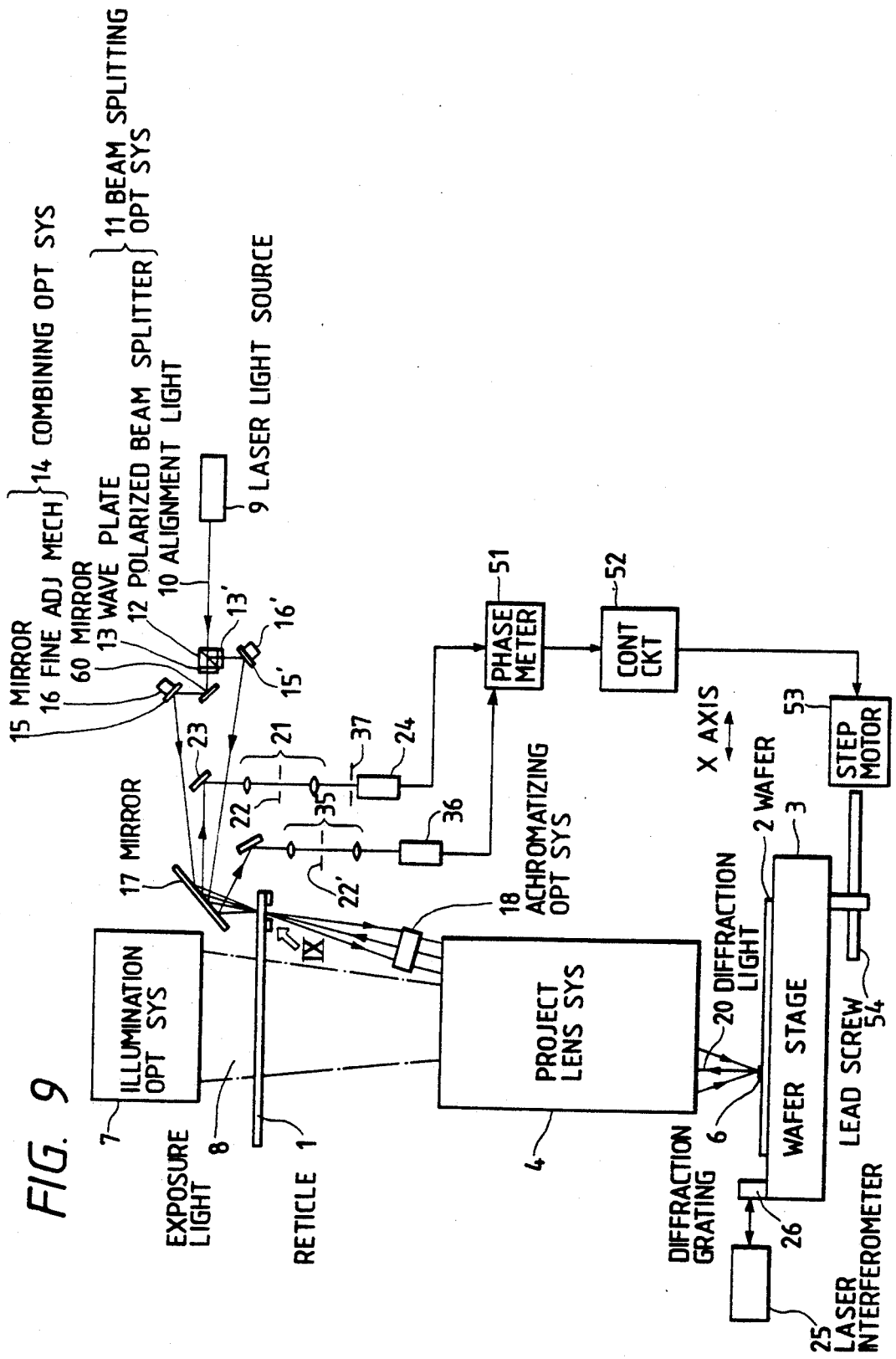
FIG. 9. is a view similar to FIG. 1 but showing a position signal producing apparatus according to a second embodiment of this invention.
Figure 10:
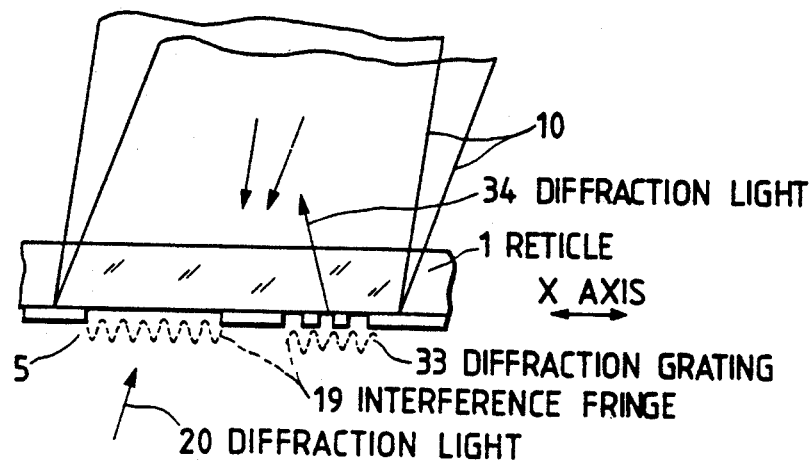
FIG. 10 is an enlarged side view of a portion indicated by the arrow IX in FIG. 9.
Figure 11:
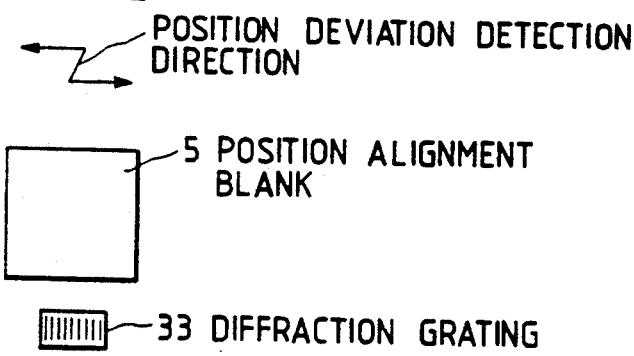
FIGS. 11 and 12 are enlarged plan views of a portion indicated by arrow IX in FIG. 9, showing the arrangement of position alignment marks on a reticle.
Figure 12:
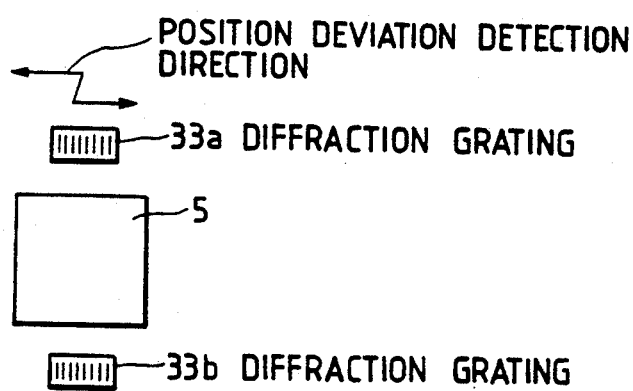
Figure 13:
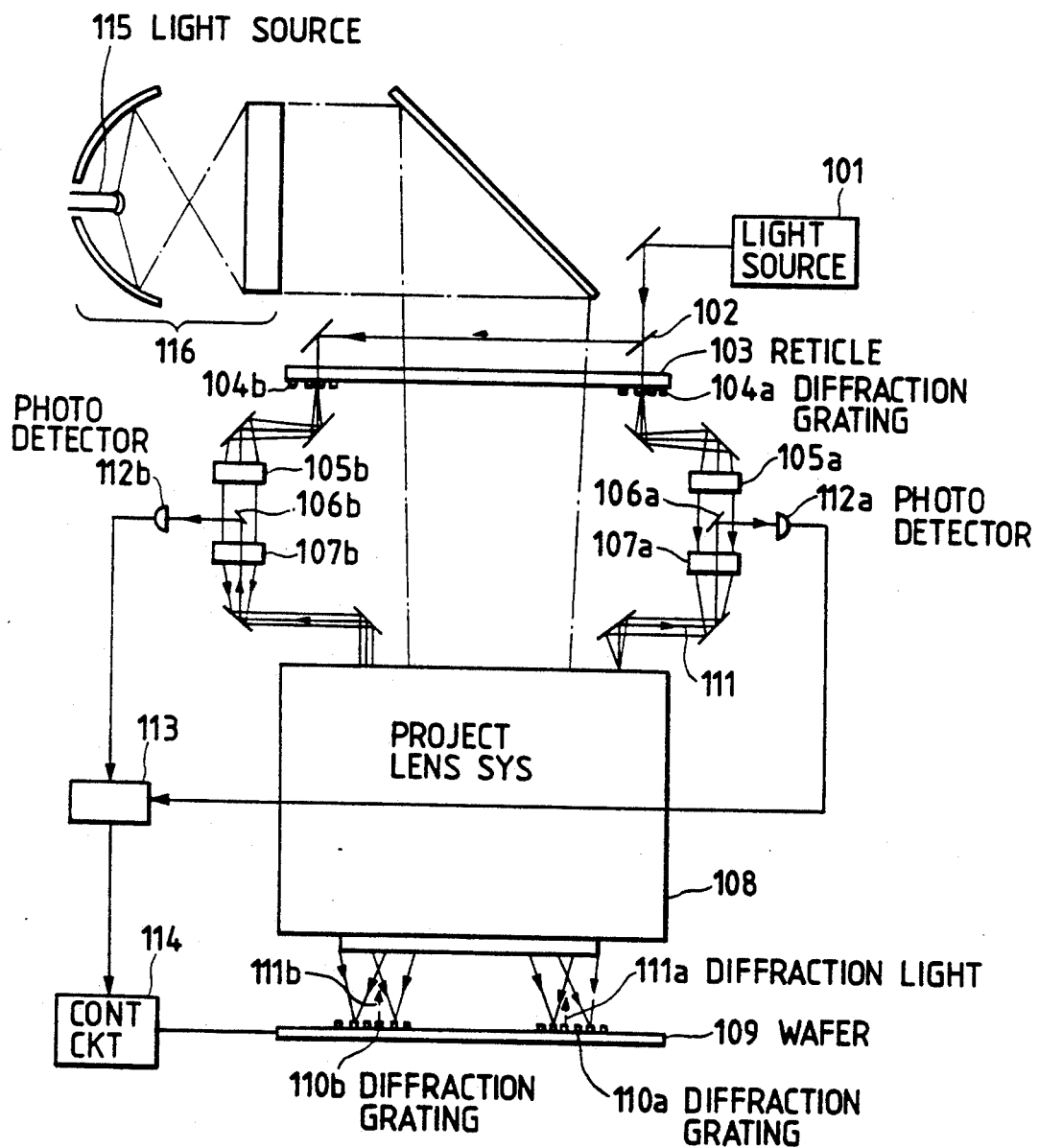
FIG. 13 is a diagrammatical view showing a position signal producing apparatus of prior art.

FIGS. 9 through 12 show a second embodiment of the invention. FIG. 9 shows general construction, FIG. 10 is an enlarged view of a portion indicated by the arrow IX in FIG. 9, and FIGS. 11 and 12 show an arrangement of position alignment marks on the reticle 1. The beam splitting optical system used in this embodiment is the same in construction as that of the second embodiment.

Basic structure for aligning the wafer 2 is the same as the structure of the first embodiment. In this embodiment, the position alignment diffraction grating 33 is further provided on the reticle 1 adjacent to the position alignment blank 5 as shown in FIG. 10, whose stripes are arranged perpendicular to X axis and diffracted light 34 from the position alignment diffraction grating 33 is detected by another photodetector 36 through another spatial filtering optical system 35. A field diaphragm 37 is provided in front of the photodetector 24 for introducing only light from the position alignment blank 5 into the photodetector 24. The pitch of the progressive type interference fringes 19 on the reticle 1 is finely adjusted by the combining optical system 14 for the alignment of the wafer 2, so that there is a possibility that a pitch error with respect to the position alignment diffraction grating 33 of the reticle 1 occurs. Thus, it is desired that the number of bars of the position alignment diffraction grating 33 of the reticle 1 is as few as possible. The reticle 1 comprises a quartz glass plate where chromium patterns are drawn, so that the diffraction efficiency is high. Thus, if the area of the position alignment diffraction grating 33 of the reticle 1 is small to some extent, there is no trouble to detect the beat signal by the photodetector 36. The same effect can be obtained by using the spatial filtering optical system 35 which limits the field of light returning from the reticle 1. FIG. 11 shows the position alignment grating 33 of the reticle 1. Since the total magnification of the project lens system 4 and the achromatizing optical system is 1.0, detection of beat signals by the photodetectors 24 and 26 is possible. By a phase comparison between these two beat signals, the relative position alignment between the reticle 1 and the wafer 2 is possible. Thus, it can be expected that an alignment accuracy of this method is higher than that done by separate alignment of the reticle 1 and the wafer 2 (through the reticle alignment or TTR alignment). Moreover, an arrangement of position alignment diffraction gratings 33a and 33b as shown in FIG. 12 can be used too. These position alignment diffraction gratings 33a and 33b feature to develop no Abbe's error in the direction of relative position deviation amount between the wafer 2 and the reticle 1 even if rotation of the progressive type interference fringes 19 occurs, in other words, the direction of gratings of the position alignment diffraction gratings 33 deviates from a direction of stripes of the progressive type interference grating 19. This is because assuming that patterns of the position alignment diffraction gratings 6 and 33 are uniform, position deviation detection amount of the reticle 1 is represented by the center of gravity of the position alignment diffraction gratings 6 and 33, so that the center of gravity of the position alignment diffraction grating 6 of the wafer 1 seemingly consists with that of the position alignment diffraction grating 33 of the reticle irrespective of the presence of rotation of the progressive type interference gratings 19.

As described above, in this invention, two different frequency components which are different from that of exposure light, included in the coherent alignment light 10 are projected onto the position alignment blank 5 provided on a specific position on the reticle 1 where the progressive type interference grating fringes 19 is formed. In this instance, the frequency components are conditioned by the mirror 60 so as to have an identical image aspect or orientation. This conditioning improves the position alignment accuracy of the apparatus. The progressive type interference grating fringes 19 are projected through the achromatizing optical system 18 and the project lens system 4 onto the wafer 2 to from another progressive type interference fringes 30 on or above the position alignment diffraction grating 6. Diffracted light 20 is transmitted through the spatial filtering optical system 21 and introduced into the photodetector 24 to detect the beat signal for providing position deviation between the reticle 1 and the wafer 2. The wafer stage 3 is moved to reduce the position deviation for providing accurate position alignment. As described above, even if the alignment light 10 whose wavelength is different from that of the exposure light 8, position alignment between the position alignment blank 5 and the wafer 2 with high accuracy is provided because the achromatizing optical system 18 compensates chromatic aberration of the project optical system 4 for the specific region where interference fringes are formed by interference of the alignment light 10.

Obviously, various minor changes and modifications of the present invention are possible in the light of the above teaching. It is therefore to be understood that within the scope of the appended claims the invention may be practiced otherwise than as specifically described.

What is claimed is:

1. A position signal producing apparatus, for use with an exposure apparatus for project-printing a pattern on a reticle onto a wafer through a project lens system with exposure light, for producing a position signal indicative of position of at least said wafer along an axis, comprising:

(a) a light source means for emitting coherent light whose frequency is different from that of said exposure light;
   (b) splitting means for splitting said coherent light into first and second light beams;
   (c) first reflecting means for reflecting said first light beam toward a given place of said reticle, said given place being on an annular region within a circle defined by field angle of said project lens system on said reticle;
   (d) second reflecting means for reflecting said second light beam toward said given place to produce first interference fringes together with said first light beam in such a manner that an angle between said first and second beams is larger than zero;
   (e) means for converting an image condition of said first light beam and said second light beam so as to form an erect image or an inverted image before said first and second light beams are projected on said given place of said reticle, said first reflecting means, said second reflecting means and said converting means being arranged to make stripes of said interference fringes perpendicular to said axis, said converting means comprising reflecting means disposed between said splitting means and said given place of said reticle for reflecting one of said first and second light beams;
   (f) achromatizing means provided between said reticle and said project lens system for receiving said first interference fringes generated by said reticle and for achromatizing said project lens system at wavelengths of said coherent light, so as to image second interference fringes on said wafer in correspondence with said first interference fringes with chromatic aberration removed, said second interference fringes having a pitch of n1;
   (g) a diffraction grating formed on said wafer where said second interference fringes are to be imaged by said project lens system through said achromatizing means, said diffraction grating producing diffracted light with said second interference fringes so that interfered light having a beat frequency is generated, a pitch of said diffraction grating being n2, the arrangement direction of the gratings of said diffraction grating being arranged parallel to said axis, said pitches n1 and n2 being selected such that they make a ratio of an integer; and
   (h) photodetection means responsive to said interfered light from said diffraction grating received through said project lens system, said achromatizing means, and said reticle for producing said position signal in accordance with a periodical change of intensity of said interfered light.

2. A position signal producing apparatus according to claim 1, wherein said splitting means comprises a polarized beam splitter which transmits one of said first and second light beams and reflects the other of said first and second light beams.

3. A position signal producing apparatus according to claim 1, wherein said first light beam has a first optical path extending between said splitting means and said given place, said second light beam has a second optical path extending between said splitting means and said given place, and said first and second optical paths have a same optical length.

4. A position signal producing apparatus according to claim 1, wherein said splitting means, said first and second reflecting means and said converting means are integrally constructed as a single unit.

5. A position signal producing apparatus according to claim 1, further comprising:

a second diffraction grating provided on said reticle and adjacent to said given place for producing a second position light signal by interference of said second diffraction grating with said interference fringes formed on said reticle and for reflecting said interference fringes by diffraction, the arrangement direction of the gratings of said second diffraction grating being arrange perpendicular to said axis; and second photodetector means responsive to said second light signal for producing a second position signal from said second diffraction grating.

6. A position signal producing apparatus according to claim 1 wherein said converting means comprises said reflecting means exclusive of refracting lenses.

7. In a position signal producing apparatus, for use with an exposure apparatus for project-printing a pattern on a reticle onto a wafer through a project lens system with exposure light, for producing a position signal indicative of position of at least said wafer along an axis, including light source means for emitting coherent light whose frequency is different from that of said exposure light and splitting means for splitting said coherent light into first and second light beams, the improvement comprising:

reproducing means for reproducing original geometric conditions when alignment light is emitted from the light source means by interfering the first and second light beams to form interference fringes, said reproducing means including superposing means for superposing the first and second light beams on the reticle, as one of an erect image and an inverted image, and for providing an angle greater than zero between the first and second light beams superposed thereby, thereby to form first interference fringes, and converting means exclusive of refractive means between the splitting means and a given place of the reticle, comprising reflecting means between the splitting means and said given place of the reticle for reflecting one of the first and second light beams.

8. An improved position signal producing apparatus according to claim 7, further comprising achromatizing means provided between the reticle and the project lens system for receiving said first interference fringes generated by said reticle and for achromatizing said project lens system at wavelengths of said coherent light, so as to image second interference fringes on the wafer in correspondence with said first interference fringes with chromatic aberration removed.

* * * * *